(12) United States Patent
Xu et al.

(10) Patent No.: US 12,021,157 B2
(45) Date of Patent: Jun. 25, 2024

(54) ELECTRODE STRUCTURE, SOLAR CELL, AND PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Qiang Xu, Jiangxi (CN); Jing Zhou, Jiangxi (CN); Yankai Qiu, Jiangxi (CN)

(73) Assignees: JINKO SOLAR CO. LTD., Jiangxi (CN); ZHEJIANG JINKO SOLAR CO., LTD., Zhejiang (CN)

( * ) Notice: Subject to any disclaimer, the term of this patent is extended or adjusted under 35 U.S.C. 154(b) by 31 days.

(21) Appl. No.: 17/964,502

(22) Filed: Oct. 12, 2022

(65) Prior Publication Data
US 2023/0139905 A1    May 4, 2023

(30) Foreign Application Priority Data

Oct. 29, 2021   (CN) .......................... 202122636021.0

(51) Int. Cl.
*H01L 31/02*  (2006.01)
*H01L 31/05*  (2014.01)
*H01L 31/18*  (2006.01)

(52) U.S. Cl.
CPC ...... *H01L 31/0201* (2013.01); *H01L 31/0504* (2013.01); *H01L 31/1868* (2013.01)

(58) Field of Classification Search
CPC ............ H01L 31/0201; H01L 31/0224; H01L 31/022441; H01L 31/02245;
(Continued)

(56) References Cited

U.S. PATENT DOCUMENTS

2016/0365469 A1* 12/2016 Steckemetz ......... H01L 31/0684
2018/0122975 A1    5/2018 Lu
(Continued)

FOREIGN PATENT DOCUMENTS

CN         102544128         7/2012
CN         203760489         8/2014
(Continued)

OTHER PUBLICATIONS

Japanese Notice of Reasons for Refusal for Application No. 2022-164474, dated May 2, 2023 (8 pages).
(Continued)

*Primary Examiner* — Mayla Gonzalez Ramos
(74) *Attorney, Agent, or Firm* — NIXON PEABODY LLP; Jeffrey L. Costellia

(57) ABSTRACT

An electrode structure, a solar cell, and a photovoltaic module are provided. The electrode structure includes: busbars extending along a first direction and each including two sub-busbars arranged opposite to each other along a second direction intersecting with the first direction, each of the sub-busbars includes first sub-portions and second sub-portions that are spaced at intervals; fingers extending along the second direction and arranged at two sides of the busbars, the fingers are connected to the sub-busbars; and electrode pads sandwiched between the first sub-portions of the two sub-busbars and connected to the first sub-portions, the first sub-portion of at least one of the sub-busbars protrude towards a side away from the electrode pads.

15 Claims, 4 Drawing Sheets

(58) Field of Classification Search
CPC ..... H01L 31/022458; H01L 31/022433; H01L 31/022425; H01L 31/048; H01L 31/0504; H01L 31/1868
See application file for complete search history.

(56) References Cited

U.S. PATENT DOCUMENTS

| | | | |
|---|---|---|---|
| 2019/0259904 A1* | 8/2019 | Kim | ................ H01L 31/022433 |
| 2020/0075788 A1 | 3/2020 | Oh et al. | |

FOREIGN PATENT DOCUMENTS

| | | |
|---|---|---|
| CN | 105514183 | 4/2016 |
| CN | 105552145 | 5/2016 |
| CN | 208000923 | 10/2018 |
| CN | 109037367 A | 12/2018 |
| CN | 211428184 U | 9/2020 |
| CN | 212303685 | 1/2021 |
| CN | 212659550 | 3/2021 |
| CN | 213459749 | 6/2021 |
| CN | 213459753 | 6/2021 |
| EP | 4 099 403 A1 | 12/2022 |
| JP | 2000164901 A | 6/2000 |
| JP | 2001-068699 | 3/2001 |
| JP | 2002-164550 | 6/2002 |
| JP | 2005-252108 | 9/2005 |
| JP | 2010-027778 | 2/2010 |
| JP | 2013004509 A | 1/2013 |
| JP | 3186623 U | 10/2013 |
| JP | 2014-216388 | 11/2014 |
| JP | 2016178280 A | 10/2016 |
| JP | 2017-005253 | 1/2017 |
| KR | 2016/0029354 | 3/2016 |
| KR | 2018/0090510 | 8/2018 |
| WO | 2016117180 A1 | 7/2016 |
| WO | WO-2020/250262 | 12/2020 |

OTHER PUBLICATIONS

European Search Report for Application No. 22201298.1, dated Mar. 30, 2023 (8 pages).
Chinese State Intellectual Property Office Evaluation Report of Utility Model Patent Right for Application No. CN-202122636021.0, dated Mar. 21, 2023 (8 pages).
U.K. Office Action (Application No. 2216013.9) dated Dec. 14, 2022 (6 pages).
Japanese Office Action for App. No. 2023-147129, dated Oct. 31, 2023 (10 pages).
Japanese Office Action for App. No. 2023-147129, mailed Apr. 2, 2024 (4 pages).
Extended European Search Report for App. No. 23207592.9 dated Mar. 11, 2024 (6 pages).

* cited by examiner

ELECTRODE STRUCTURE, SOLAR CELL, AND PHOTOVOLTAIC MODULE

CROSS-REFERENCE TO RELATED APPLICATIONS

The present application claims priority to Chinese Patent Application No. 202122636021.0, filed on Oct. 29, 2021, the content of which is incorporated herein by reference in its entirety.

TECHNICAL FIELD

The present disclosure relates to the field of photovoltaic technologies, and in particular, to an electrode structure, a solar cell, and a photovoltaic module.

BACKGROUND

A solar cell is a photoelectric semiconductor sheet that uses sunlight to generate power, also known as a "solar chip" or "photocell". The design of the solar cell through a plurality of busbars can reduce paths for transmitting photogenerated currents to the busbars, so as to reduce consumption caused by movement of the currents on fingers, and can also reduce an area shielded by the fingers and reduce consumption of silver paste. When the solar cell designed through the busbars forms a solar cell string through an ultra-thin solder strip, electrode pads may be in poor contact with the solder strip to result in cold soldering, which easily leads to reduction of power of the solar cell string, resulting in overall power losses of a solar module.

Therefore, it is urgent to provide an electrode structure, a solar cell, and a photovoltaic module to solve the above problems.

SUMMARY

In view of the above, the present disclosure provides an electrode structure, a solar cell, and a photovoltaic module.

In an aspect, the present disclosure provides an electrode structure, including: busbars extending along a first direction and each including two sub-busbars arranged opposite to each other along a second direction intersecting with the first direction, each of the sub-busbars includes first sub-portions and second sub-portions that are spaced at intervals; fingers extending along the second direction and arranged at two sides of the busbars, the fingers are connected to the sub-busbars; and electrode pads sandwiched between the first sub-portions of the two sub-busbars and connected to the first sub-portions, the first sub-portion of at least one of the sub-busbars protrude towards a side away from the electrode pads.

In another aspect, the present disclosure further provides a solar cell, including: a silicon wafer including an emitter layer on one side of the silicon wafer; a first passivation layer arranged on a side of the emitter layer away from the silicon wafer; a second passivation layer arranged on a side of the silicon wafer away from the emitter layer; and an electrode structure arranged on a side of the first passivation layer away from the silicon wafer, and/or arranged on a side of the second passivation layer away from the silicon wafer. The electrode structure includes: busbars extending along a first direction and each including two sub-busbars arranged opposite to each other along a second direction intersecting with the first direction, each of the sub-busbars includes first sub-portions and second sub-portions that are spaced at intervals; fingers extending along the second direction and arranged at two sides of the busbars, the fingers are connected to the sub-busbars; and electrode pads sandwiched between the first sub-portions of the two sub-busbars and connected to the first sub-portions, the first sub-portion of at least one of the sub-busbars protrude towards a side away from the electrode pads. Along the second direction, a maximum distance between adjacent first sub-portions in one of the busbars is $l_1$, a distance between adjacent second sub-portions in one of the busbars is $l_2$, where $1.2 \leq l_1/l_2 \leq 2$.

In a further aspect, the present disclosure further provides a photovoltaic module, including a transparent cover plate, an upper packaging layer, a lower packaging layer, and a back plate, and at least one solar cell. The solar cell includes: a silicon wafer including an emitter layer on one side of the silicon wafer; a first passivation layer arranged on a side of the emitter layer away from the silicon wafer; a second passivation layer arranged on a side of the silicon wafer away from the emitter layer; and an electrode structure arranged on a side of the first passivation layer away from the silicon wafer, and/or arranged on a side of the second passivation layer away from the silicon wafer. The electrode structure includes: busbars extending along a first direction and each including two sub-busbars arranged opposite to each other along a second direction intersecting with the first direction, each of the sub-busbars includes first sub-portions and second sub-portions that are spaced at intervals; fingers extending along the second direction and arranged at two sides of the busbars, the fingers are connected to the sub-busbars; and electrode pads sandwiched between the first sub-portions of the two sub-busbars and connected to the first sub-portions, the first sub-portion of at least one of the sub-busbars protrude towards a side away from the electrode pads. Along the second direction, a maximum distance between adjacent first sub-portions in one of the busbars is $l_1$, a distance between adjacent second sub-portions in one of the busbars is $l_2$, where $1.2 \leq l_1/l_2 \leq 2$.

Other features of the present disclosure and advantages thereof will become clear from the following detailed description of exemplary embodiments of the present disclosure with reference to the accompanying drawings.

BRIEF DESCRIPTION OF DRAWINGS

The accompanying drawings, which are incorporated in and constitute a part of the specification, illustrate embodiments of the present disclosure and, together with the description, serve to explain principles of the present disclosure.

DESCRIPTION OF EMBODIMENTS

Various exemplary embodiments of the present disclosure are now described in detail with reference to the accompanying drawings. It should be noted that, unless otherwise stated, relative arrangement of the components and order of steps, the numerical expressions, and the values set forth in the embodiments are not intended to limit the scope of the present disclosure.

The following description of at least one exemplary embodiment is merely illustrative, and shall not be interpreted as any limitations on the present disclosure and application or use thereof.

Technologies, methods, and devices known to those of ordinary skill in the related art may not be discussed in detail, but where appropriate, such technologies, methods, and devices should be considered as part of the specification.

In all the examples shown and discussed herein, any specific value should be construed as merely illustrative and not as any limitation. Therefore, other examples of exemplary embodiments may have different values.

It should be noted that similar reference signs denote similar terms in the accompanying drawings, and therefore, once an item is defined in a drawing, there is no need for further discussion in the accompanying drawings.

Figure 1:
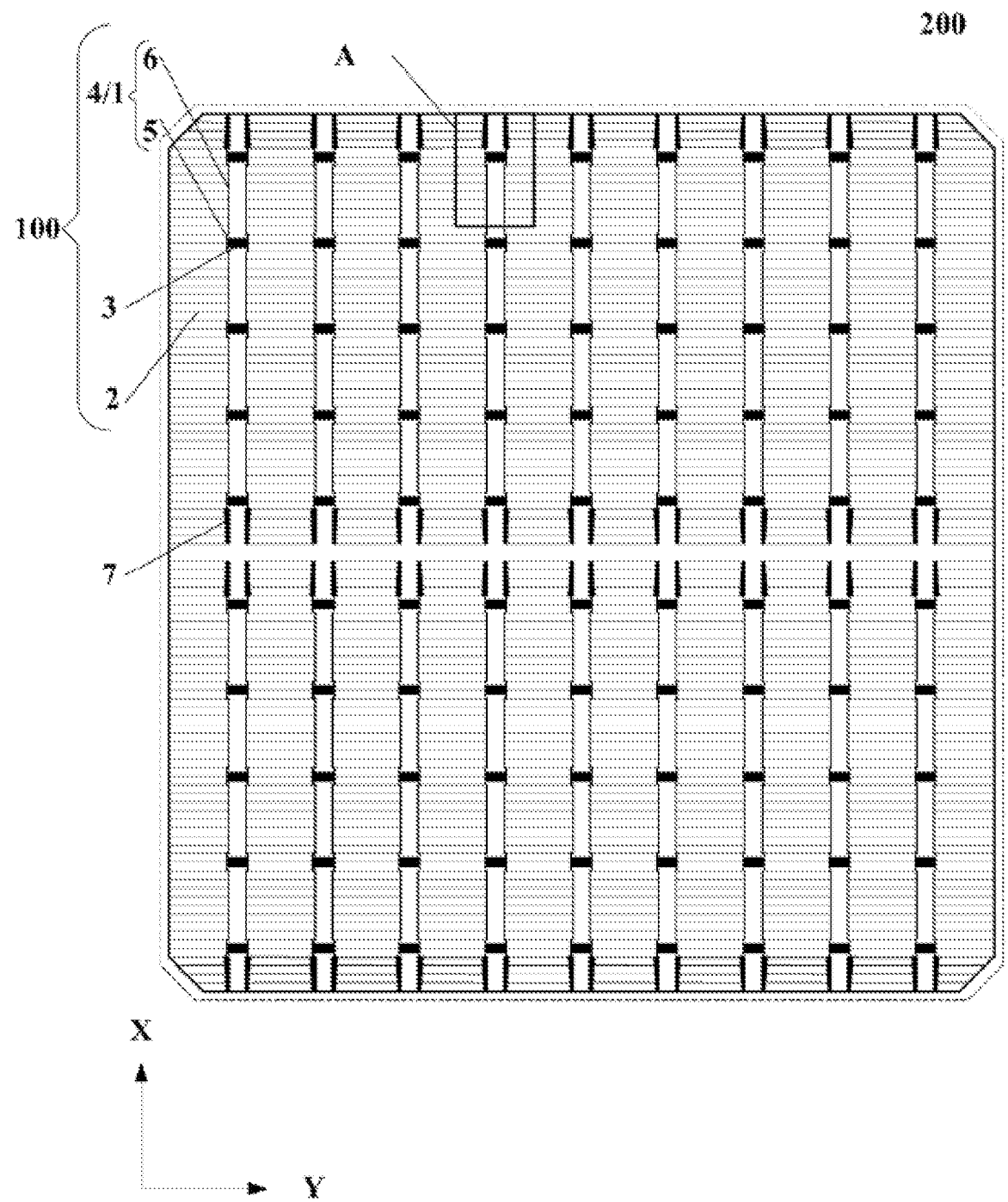
FIG. 1 is a schematic diagram of a plane structure of a solar cell according to one or more embodiments of the present disclosure.

Referring to FIG. 1, FIG. 1 is a schematic diagram of a plane structure of a solar cell 200 according to one or more embodiments of the present disclosure.

An electrode structure 100 according to some embodiments includes busbars 1, fingers 2, and electrode pads 3.

The busbars 1 extend along a first direction X, each of the busbars 1 includes two sub-busbars 4 arranged opposite to each other along a second direction Y, each of the sub-busbars 4 includes first sub-portions 5 and second sub-portions 6 that are spaced from each other, the electrode pads 3 are sandwiched between the first sub-portions 5 of the two sub-busbars 4 and connected to the first sub-portions 5, the first sub-portions 5 of at least one of the sub-busbars 4 protrude towards the side away from the electrode pads 3, and the second direction Y intersects with the first direction X. Along the second direction, a maximum distance between adjacent first sub-portions 5 in one of the busbars 1 is $l_1$, a distance between adjacent second sub-portions 6 in one of the busbars 1 is $l_2$, where $1.2 \leq l_1/l_2 \leq 2$.

The fingers 2 extend along the second direction Y and are arranged on two sides of the busbar 1 and connected to the sub-busbars 4.

It is to be noted that FIG. 1 merely illustrates that each first sub-portion 5 protrudes towards the side away from the electrode pad 3. Alternatively, in one busbar 1, the first sub-portions 5 of only one sub-busbar 4 protrude towards the side away from the electrode pad 3. Alternatively, in one busbar 1, the first sub-portions 5 of two sub-busbars 4 protruding towards the side away from the electrode pads 3 are alternately arranged. Details are not described herein. FIG. 1 illustrates that lengths of the second sub-portions 6 are all equal along the first direction X. In practical applications, a distance between two adjacent first sub-portions 5 of one sub-busbar 4 may be adjusted through the lengths of the second sub-portions 6 along the first direction X. In addition, numbers of the busbars 1, the fingers 2, and the electrode pads 3 in FIG. 1 are only illustrative, which may be adjusted as required.

It may be understood that the fingers 2 have the function of collecting carriers and transmitting the carriers to the busbars 1, the busbars 1 conduct the collected currents to the electrode pads 3, and the electrode pads 3 are connected to the solder strip to conduct the current out. The busbars 1 and the fingers 2 are integrally manufactured by screen printing, or the busbars 1 and the fingers 2 are printed separately, which is not limited herein. The busbars 1 and the fingers 2 are generally made of silver, but are not limited thereto, which may also be made of aluminum or other materials as required. The busbars 1 each include two sub-busbars 4, so that the solder strip can be limited between the two sub-busbars 4 of the busbar 1 and the solder strip can directly contact the electrode pads 3, which reduces micro cracks during the soldering of the solder strip with the electrode pads 3 and can reduce the repair rate caused by the micro cracks during the soldering. Upon testing, the repair rate is reduced by 39%, and a layer repair rate is reduced from 16.93% to 10.31%.

Compared with the related art, the electrode structure 100 according to this embodiment has at least the following beneficial effects.

The busbars 1 extend along a first direction X, each of the busbars 1 includes two sub-busbars 4 arranged opposite to each other along a second direction Y, and each of the sub-busbars 4 includes first sub-portions 5 and second sub-portions 6 that are spaced from each other. When a solder strip is assembled, the solder strip is limited between the two sub-busbars 4 of one of the busbars 1 and can directly contact the electrode pads 3, which helps to improve soldering tension between the solder strip and the electrode pads 3 and can also reduce the probability of micro cracks during assembly. The electrode pads 3 are sandwiched between the first sub-portions 5 of the two sub-busbars 4 and connected to the first sub-portions 5, the first sub-portions 5 of at least one of the sub-busbars 4 protrude towards the side away from the electrode pads 3, and the second direction Y intersects with the first direction X. Since the electrode pads 3 are connected to the first sub-portions 5 and the first sub-portions 5 are expanded, a soldering window is widened. Along a direction perpendicular to a plane where the electrode structure 100 is located, differences exist between heights of the sub-busbars 4 and heights of the electrode pads 3, which may not affect the connection between the solder strip and the electrode pads 3. Even if the solder strip deviates slightly, the solder strip may be at least partially connected to the electrode pads 3, which effectively avoids cold soldering during the soldering of the electrode pads 3 with the solder strip. Moreover, the range is appropriately defined as $1.2 \leq l_1/l_2 \leq 2$. When $l_1/l_2$ is less than 1.2, in one of the busbars 1, a difference between the maximum distance between the adjacent first sub-portions 5 and the distance between the adjacent second sub-portions 6 is small, which is not conducive to the manufacturing and does not evidently avoid the cold soldering. When $l_1/l_2$ is greater than 2, silver paste may be wasted, and a double-side performance of a solar cell using the electrode structure 100 is affected.

Figure 2:
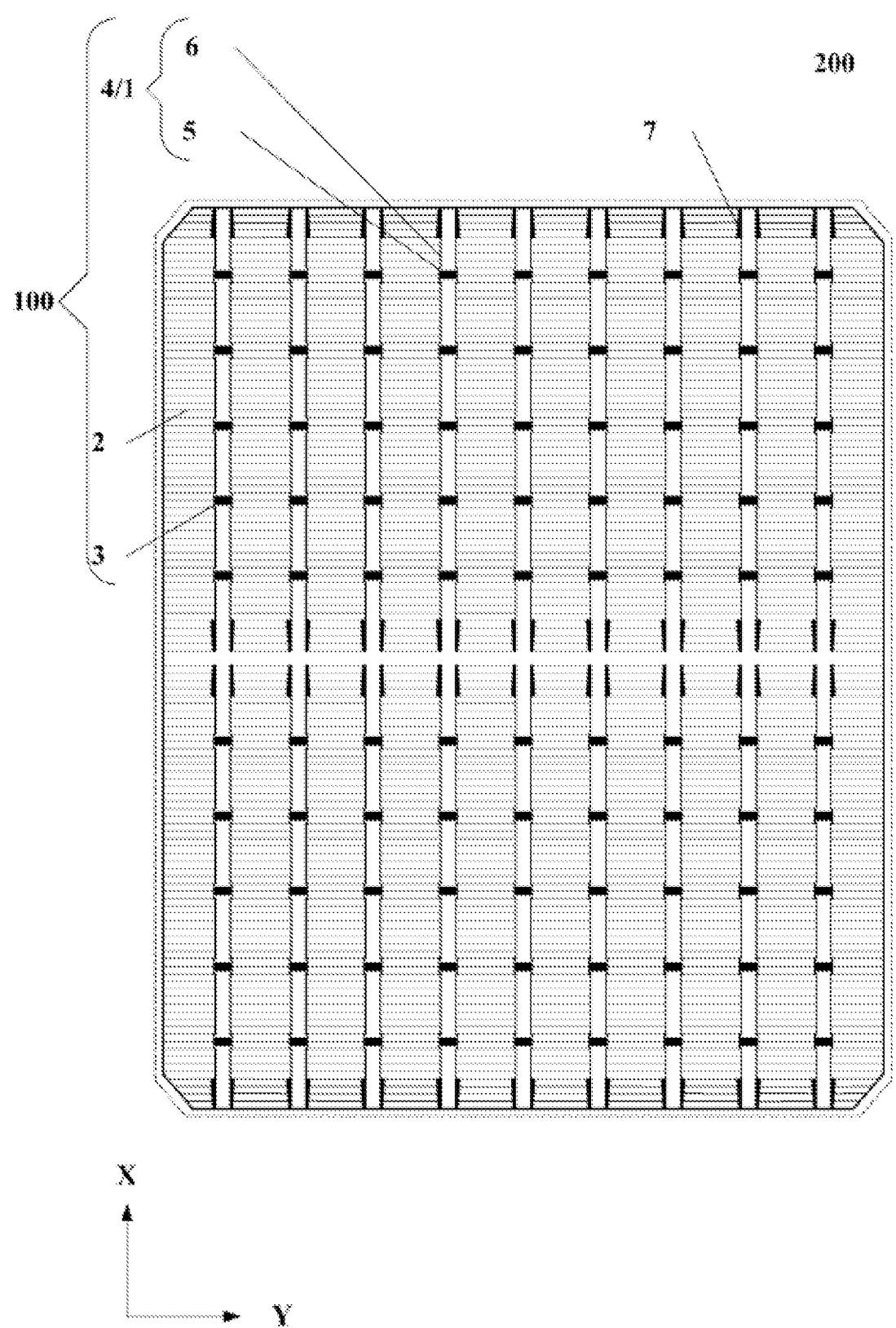
FIG. 2 is a schematic diagram of a plane structure of another solar cell according to one or more embodiments of the present disclosure.

In some embodiments, referring to FIG. 1 and FIG. 2, FIG. 2 is a schematic diagram of a plane structure of another solar cell 200 according to one or more embodiments of the present disclosure. Connecting end portions 7 are arranged at two ends of the sub-busbars 4, the connecting end portions 7 are connected to the first sub-portions 5. In the connecting end portions 7 and the first sub-portions 5 that are connected, widths of the connecting end portions 7 in the second direction Y gradually decrease along a direction from the first sub-portions 5 pointing to the connecting end portions 7.

Additionally or alternatively, the connecting end portions 7 are connected to the second sub-portions 6, and in the connecting end portions 7 and the second sub-portions 6 that are connected, widths of the connecting end portions 7 in the second direction Y gradually decrease along a direction from the second sub-portions 6 pointing to the connecting end portions 7.

It is to be noted that FIG. 1 illustrates that two ends of the connecting end portions 7 are connected to the first sub-portions 5, and FIG. 2 illustrates that the two ends of the connecting end portions 7 are connected to the second sub-portions 6. Alternatively, the connecting end portions 7 have one end connected to the first sub-portions 5 and the other end connected to the second sub-portions 6. Details are not described herein. Orthographic projections of the connecting end portions 7 in the direction of the plane where the electrode structure 100 is located may be trapezoidal or triangular. FIG. 1 and FIG. 2 only illustrate that all the electrode pads 3 are rectangles of a same size. During practical arrangement, in a plurality of electrode pads 3 sequentially arranged along the first direction X, sizes of the electrode pads 3 in the head and the electrode pads 3 in the tail are slightly larger than those of the electrode pads 3 in the middle part, which can prevent deviation of the solder strip and can be adjusted according to actual requirements. Moreover, FIG. 1 and FIG. 2 only illustrate that the solar cell using the electrode structure 100 according to embodiments of the present disclosure is divided into two half-cut cells, which may certainly also be designed as multiple cut cells according to actual requirements and is not limited herein.

It may be understood that, along the first direction X, when the sub-busbars 4 between two adjacent electrode pads 3 conduct the current, the current may be conducted to either of the two electrode pads 3. Along the first direction X, the sub-busbars 4 between the electrode pads 3 in the head and edges of the electrode structure 100 can only conduct the current to the electrode pads 3 in the head. Similarly, along the first direction X, the sub-busbars 4 between the electrode pads 3 in the tail and the edges of the electrode structure 100 can only conduct the current to the electrode pads 3 in the tail. Therefore, widths of the connecting end portions 7 arranged at two ends of the sub-busbars 4 along the second direction Y are designed as gradually varying with a gradient, which can help to collect currents at the edges of the electrode structure 100, improve conductivity efficiency, and alleviate blackening at the edges of the electrode structure 100.

Figure 3:
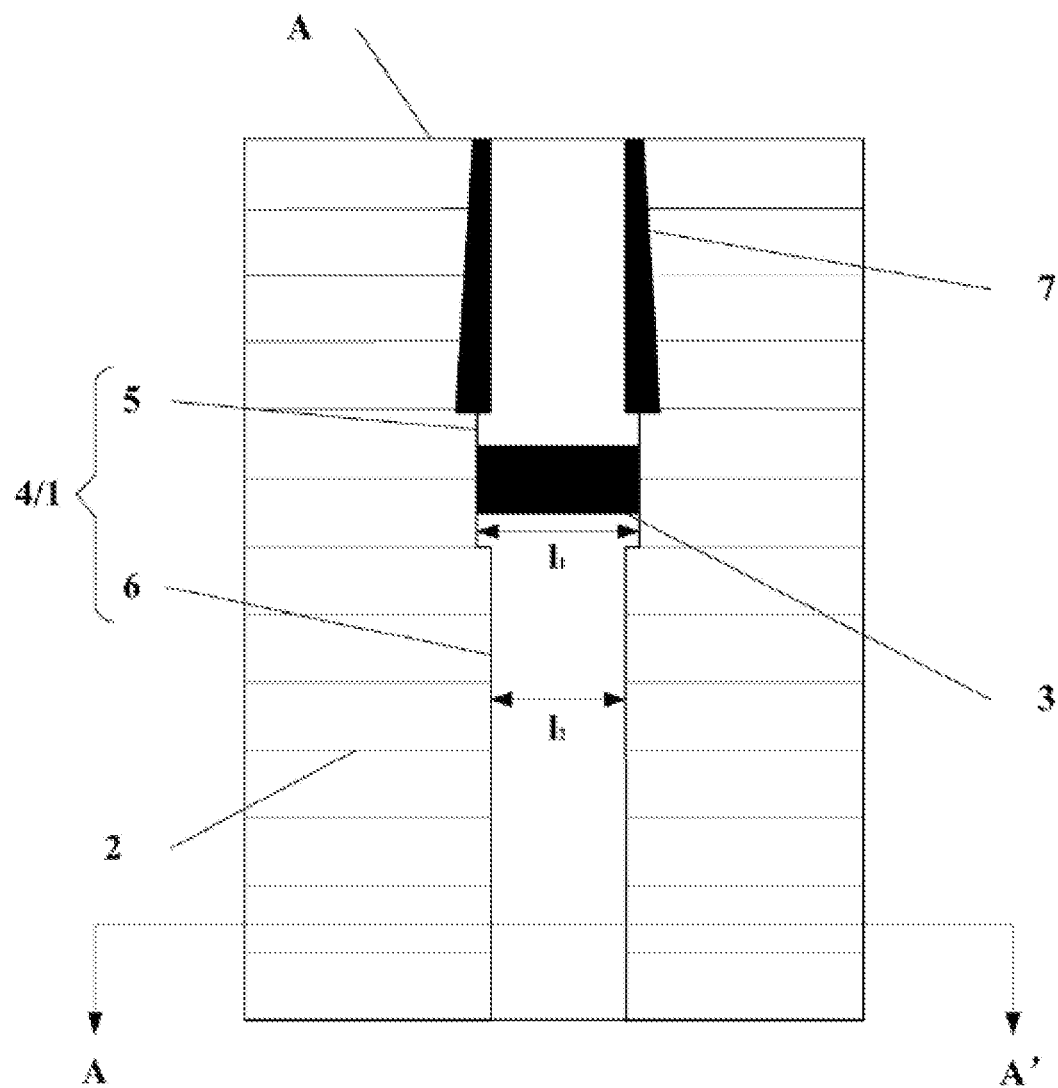
FIG. 3 is an enlarged view of portion A in FIG. 1.

In some embodiments, referring to FIG. 3, FIG. 3 is an enlarged view of portion A in FIG. 1. Distances between the connecting end portions 7 of the two sub-busbars 4 in one of the busbars 1 are equal along the second direction Y.

It may be understood that, in the two sub-busbars 4 of one busbar 1, a projection of a region between two opposite connecting end portions 7 in the direction of the plane where the electrode structure 100 is located is rectangular. A solder strip is arranged in the rectangular region, so that the solder strip can be ensured to be located between the two sub-busbars 4 of one busbar 1, thereby preventing cold soldering caused by height differences between the connecting end portions 7 and the electrode pads 3 due to the connection of the solder strip with the connecting end portions 7.

In some embodiments, the distances between the connecting end portions 7 of the two sub-busbars 4 in one of the busbars 1 range from 0.5 mm to 3.0 mm along the second direction Y.

It is to be noted that, along the second direction Y, in one of the busbars 1, when the distances between the connecting end portions 7 of the two sub-busbars 4 are less than 0.5 mm, the requirement on the soldering is relatively high. When the distances between the connecting end portions 7 of the two sub-busbars 4 are greater than 3.0 mm, transfer efficiency may be affected. In the present disclosure, the distances between the connecting end portions 7 of the two sub-busbars 4 in one of the busbars 1 ranging from 0.5 mm to 3.0 mm can meet the requirement on the soldering and can also ensure the transfer efficiency.

It may be understood that the distances between the connecting end portions 7 of the two sub-busbars 4 in one of the busbars 1 along the second direction Y depend on the width of the solder strip along the second direction Y, which may be adjusted based on actual requirements. For example, the distances between the connecting end portions 7 of the two sub-busbars 4 in one of the busbars 1 range from 0.5 mm to 3.0 mm along the second direction Y, but is not limited thereto.

In some embodiments, along the second direction Y, widths of the sides of the connecting end portions 7 away from the electrode pads 3 are greater than or equal to 0.1 mm, and widths of the sides of the connecting end portions 7 close to the electrode pads 3 are less than or equal to 2 mm.

It is to be noted that the connecting end portions 7 are generally formed by paste printing, but in this way, it is difficult to make the widths of the sides of the connecting end portions 7 away from the electrode pads 3 less than 0.1 mm along the second direction Y. If the widths of the sides of the connecting end portions 7 close to the electrode pads 3 are greater than 2 mm along the second direction Y, a double-side performance of the solar cell using the electrode structure 100 may be affected. In the present disclosure, along the second direction Y, widths of the sides of the connecting end portions 7 away from the electrode pads 3 are greater than or equal to 0.1 mm, and widths of the sides of the connecting end portions 7 close to the electrode pads 3 are less than or equal to 2 mm, which can satisfy printing requirements and can also ensure the double-side performance of the solar cell using the electrode structure 100.

It may be understood that shapes and sizes of the connecting end portions 7 are designed according to sizes of the busbars 1, which may vary as the widths of the busbars 1 along the second direction Y change. When the widths of the sides of the connecting end portions 7 away from the electrode pads 3 along the second direction Y are determined, since the widths of the connecting end portions 7 along the second direction Y are designed as gradually varying with a gradient, the widths of the sides of the connecting end portions 7 close to the electrode pads 3 along the second direction Y are greater than the widths of the sides of the connecting end portions 7 away from the electrode pads 3 along the second direction Y. For example, along the second direction Y, widths of the sides of the connecting end portions 7 away from the electrode pads 3 are greater than or equal to 0.1 mm, and widths of the sides of the connecting end portions 7 close to the electrode pads 3 are less than or equal to 2 mm, but is not limited thereto.

In some embodiments, at least 3 electrode pads 3 are provided.

It is to be noted that the number of the electrode pads 3 is generally even, such as 4, 6, or 8, but the specific setting may be adjusted according to an actual requirement.

It may be understood that a plurality of electrode pads 3 may be provided. If the electrode structure 100 has a plurality of electrode pads 3, current conduction is more uniform, which is conducive to improving the efficiency of the electrode structure 100. At the same time, electroluminescence (EL) of the module is brighter, which is conducive to improving power of the module.

In some embodiments, still referring to FIG. 3, the two sub-busbars 4 of one of the busbars 1 are symmetrically arranged. The maximum distance $l_1$ between the adjacent first sub-portions 5 ranges from 1.2 mm to 1.8 mm along the second direction Y. The distance $l_2$ between the adjacent second sub-portions 6 ranges from 0.9 mm to 1.5 mm along the second direction Y.

It is to be noted that, if the maximum distance $l_1$ between the adjacent first sub-portions 5 is less than 1.2 mm along the second direction Y, the widths of the electrode pads 3 along the second direction Y may be reduced, and the contact area between the electrode pads 3 and the solder strip may be reduced. If the maximum distance $l_1$ between the adjacent first sub-portions 5 is greater than 1.8 mm along the second direction Y, the widths of the electrode pads 3 along the second direction Y may be increased, resulting in unnecessary waste. Along the second direction Y, the distance 12 between the adjacent second sub-portions 6 is less than the maximum distance $l_1$ between the adjacent first sub-portions 5.

It may be understood that the maximum distance $l_1$ between the adjacent first sub-portions 5 ranges from 1.2 mm to 1.8 mm along the second direction Y and the distance 12 between the adjacent second sub-portions 6 ranges from 0.9 mm to 1.5 mm along the second direction Y, which facilitates good soldering of the electrode pads 3 with the solder strip.

In some embodiments, along the first direction X, the electrode pads 3 are in contact with the sub-busbars 4, and a length of a contact region ranges from 0.5 mm to 5.0 mm.

It is to be noted that, when the length of the contact region is less than 0.5 mm along the first direction X, it is not conducive to the soldering. When the length of the contact region is greater than 5.0 mm along the first direction X, silver paste is wasted, and the region is excessively shielded. In the present disclosure, along the first direction X, the electrode pads 3 is in contact with the sub-busbars 4, and a length of a contact region ranging from 0.5 mm to 5.0 mm can facilitate the soldering and can also save the amount of silver paste and reduce the costs.

It may be understood that, when the solder strip is soldered with the electrode pads 3, the electrode pads 3 match the first sub-portions 5, and the lengths of the electrode pads 3 along the first direction X are less than or equal to the lengths of the first sub-portions 5 along the first direction X. In the present disclosure, the length of the contact region ranges from 0.5 mm to 5.0 mm along the first direction X, which can ensure effectiveness of the contact. The range is not limited thereto, which may be adjusted as required.

In some embodiments, widths of the sub-busbars 4 range from 0.2 mm to 0.6 mm along the second direction Y.

It is to be noted that, along the second direction Y, when the widths of the sub-busbars 4 are less than 0.2 mm, efficiency of current conduction is affected. When the widths of the sub-busbars 4 are greater than 0.6 mm, the efficiency of current conduction is improved, but the double-side performance of the solar cell using the electrode structure 100 in this situation may be reduced. In the present disclosure, widths of the sub-busbars 4 ranging from 0.2 mm to 0.6 mm along the second direction Y can satisfy efficiency of current transfer of the sub-busbars 4 and can also ensure the double-side performance of the solar cell using the electrode structure 100 described as above.

It may be understood that, in the related art, the widths of the busbars 1 along the second direction Y range from 1.0 mm to 1.5 mm. Widths of the busbars 1 according to the present disclosure along the second direction Y range from 0.4 mm to 1.2 mm, so that the widths of the busbars 1 according to the present disclosure along the second direction Y are narrower than those in the related art, which can reduce the amount of silver paste, reduce shielded regions, and increase the double-side performance of the solar cell using the electrode structure 100 in this embodiment. In that the present disclosure, widths of the sub-busbars 4 range from 0.2 mm to 0.6 mm along the second direction Y, and the widths of the busbars 1 along the second direction Y may also be set to be wider than or equal to those in the related art according to an actual requirement, which is not limited herein.

Figure 4:
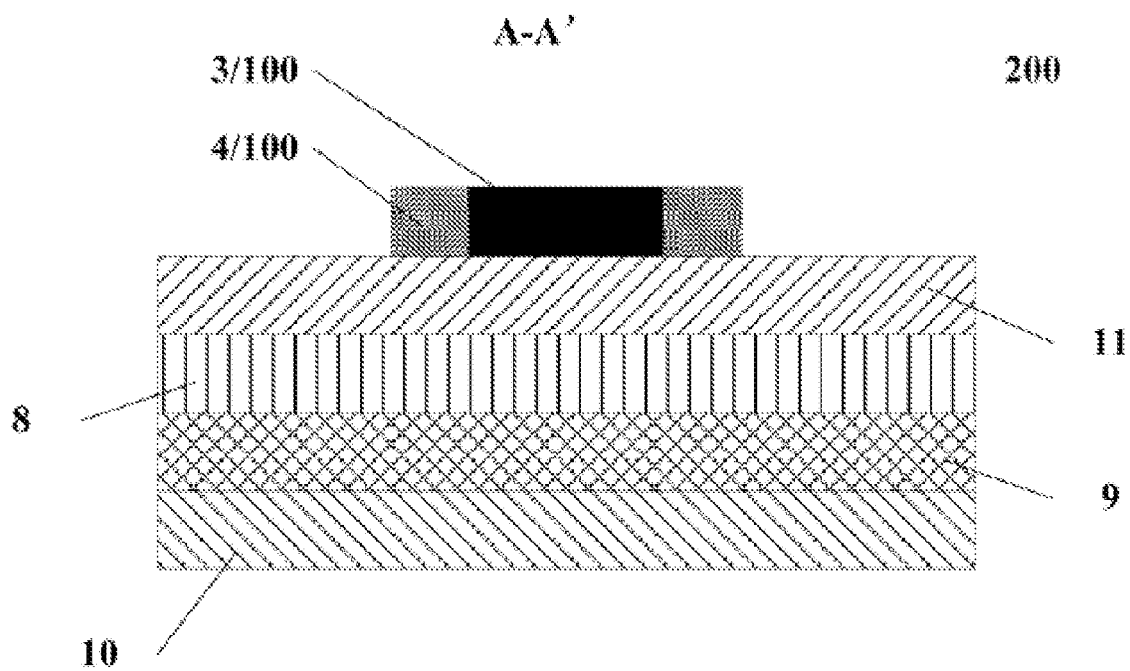
FIG. 4 is a sectional view taken along a direction A-A' in FIG. 3.

The present disclosure provides a solar cell 200. Referring to FIG. 4, FIG. 4 is a sectional view taken along a direction A-A' in FIG. 3.

The solar cell 200 according to some embodiments includes: a silicon wafer 8, the silicon wafer 8 is provided with an emitter layer 9 on one side; a first passivation layer 10 arranged on the side of the emitter layer 9 away from the silicon wafer 8; a second passivation layer 11 arranged on the side of the silicon wafer 8 away from the emitter layer 9; and an electrode structure 100 arranged on the side of the first passivation layer 10 away from the silicon wafer 8, and/or arranged on the side of the second passivation layer 11 away from the silicon wafer 8. The electrode structure 100 is the electrode structure 100 described above.

It is to be noted that FIG. 4 only illustrates that the solar cell 200 is a Passivated Emitter and Rear Cell (PERC) double-sided cell. The electrode structure 100 is arranged on the side of the second passivation layer 11 away from the silicon wafer 8. However, the electrode structure 100 may be arranged only on the side of the first passivation layer 10 away from the silicon wafer 8 or only on the side of the second passivation layer 11 away from the silicon wafer 8, or the electrode structure 100 is arranged on both the side of the first passivation layer 10 away from the silicon wafer 8 and the side of the second passivation layer 11 away from the silicon wafer 8, thereby increasing the double-side performance of the solar cell 200. The solar cell 200 may also be an N-type Tunnel Oxide Passivated Contact (TOPCon) solar cell or other types of solar cells. The N-type TOPCon solar cell includes a first passivation layer 10, an emitter layer 9, a silicon wafer 8, an ultra-thin oxide layer, a doped polysilicon layer, and a back passivation layer.

It may be understood that the solar cell 200 according to some embodiments of the present disclosure has the beneficial effects of the electrode structure 100 according to embodiments of the present disclosure. Details can be obtained with reference to the description of the electrode structure 100 in the above embodiments, which are not described herein.

Figure 5:
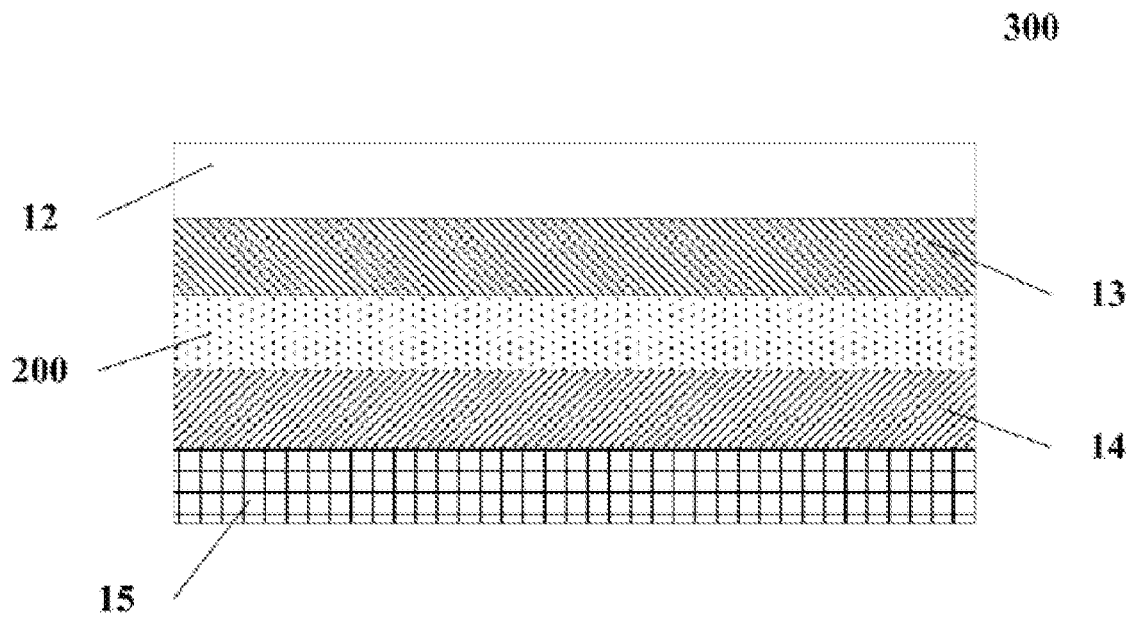
FIG. 5 is a schematic structural diagram of a photovoltaic module according to one or more embodiments of the present disclosure.

The present disclosure further provides a photovoltaic module 300. Referring to FIG. 5, FIG. 5 is a schematic structural diagram of a photovoltaic module 300 according to one or more embodiments of the present disclosure.

The photovoltaic module 300 includes a transparent cover plate 12, an upper packaging layer 13, a solar cell 200, a lower packaging layer 14, and a back plate 15. The solar cell 200 is the solar cell 200 described above. It may be understood that the photovoltaic module 300 according to the present disclosure has the beneficial effects of the solar cell 200 according to the present disclosure. Details can be obtained with reference to the description of the solar cell 200 in the above embodiments, which are not described herein.

As can be known from the above embodiments, the electrode structure, the solar cell, and the photovoltaic module according to the present disclosure achieve at least the following beneficial effects.

The busbars extend along a first direction, each of the busbars includes two sub-busbars arranged opposite to each other along a second direction, and each of the sub-busbars includes first sub-portions and second sub-portions that are spaced from each other. When a solder strip is assembled, the solder strip is limited between the two sub-busbars of one of the busbars and can directly contact the electrode pads, which helps to improve soldering tension between the solder strip and the electrode pads and can also reduce the probability of micro cracks during assembly. The electrode pads are sandwiched between the first sub-portions of the two sub-busbars and connected to the first sub-portions, the first sub-portions of at least one of the sub-busbars protrude towards the side away from the electrode pads, and the second direction intersects with the first direction. Since the electrode pads are connected to the first sub-portions and the first sub-portions are expanded, a soldering window is widened. Along the direction perpendicular to the plane where the electrode structure is located, differences exist between heights of the sub-busbars and heights of the electrode pads, which may not affect the connection between the solder strip and the electrode pads. Even if the solder strip deviates slightly, the solder strip may be at least partially connected to the electrode pads, which effectively avoids cold soldering during the soldering of the electrode pads with the solder strip. Moreover, the range of $l_1/l_2$ is set as $1.2 \leq l_1/l_2 \leq 2$, to avoid the situations when $l_1/l_2$ is less than 1.2, in one of the busbars, a difference between the maximum distance between the adjacent first sub-portions and the distance between the adjacent second sub-portions is small, which is not conducive to the manufacturing and does not evidently avoid the cold soldering; and when $l_1/l_2$ is greater than 2, silver paste may be wasted, and a double-side performance of a solar cell using the electrode structure is affected.

Although some embodiments of the present disclosure have been described in detail through examples, it should be understood by those skilled in the art that the above examples are for illustrative purposes only and not intended to limit the scope of the present disclosure. It should be understood by those skilled in the art that the above embodiments can be modified without departing from the scope and spirit of the disclosure. The scope of the present disclosure is defined by the appended claims.

What is claimed is:

1. An electrode structure, comprising:
   busbars extending along a first direction and each including two sub-busbars arranged opposite to each other along a second direction intersecting with the first direction, wherein each of the sub-busbars includes first sub-portions and second sub-portions that are spaced at intervals,
   fingers extending along the second direction and arranged at two sides of the busbars, wherein the fingers are connected to the sub-busbars, and
   electrode pads sandwiched between the first sub-portions of the two sub-busbars and connected to the first sub-portions, wherein the first sub-portion of at least one of the sub-busbars protrude towards a side away from the electrode pads,
   wherein connecting end portions are provided at two ends of each of the sub-busbars, the connecting end portions are connected to the first sub-portions, and in the connecting end portions and the first sub-portions that are connected, widths of the connecting end portions in the second direction gradually decrease along a direction from the first sub-portions pointing to the connecting end portions; and/or
   the connecting end portions are connected to the second sub-portions, and in the connecting end portions and the second sub-portions that are connected, widths of the connecting end portions in the second direction gradually decrease along a direction from the second sub-portions pointing to the connecting end portions.

2. The electrode structure according to claim 1, wherein along the second direction, distances between the connecting end portions of the two sub-busbars in one of the busbars are equal.

3. The electrode structure according to claim 2, wherein along the second direction, the distances between the connecting end portions of the two sub-busbars in one of the busbars range from 0.5 mm to 3.0 mm.

4. The electrode structure according to claim 1, wherein along the second direction, widths of sides of the connecting end portions away from the electrode pads are greater than or equal to 0.1 mm, and widths of sides of the connecting end portions close to the electrode pads are less than or equal to 2 mm.

5. The electrode structure according to claim 1, wherein the two sub-busbars of one of the busbars are symmetrically arranged;
   along the second direction, a maximum distance between adjacent first sub-portions ranges from 1.2 mm to 1.8 mm, and
   along the second direction, a distance between adjacent second sub-portions ranges from 0.9 mm to 1.5 mm.

6. The electrode according to claim 1, wherein along the first direction, the electrode pads are in contact with the sub-busbars, and a length of a contact region ranges from 0.5 mm to 5.0 mm.

7. The electrode according to claim 1, wherein along the second direction, widths of the sub-busbars range from 0.2 mm to 0.6 mm.

8. A solar cell, comprising:
   a silicon wafer including an emitter layer on one side of the silicon wafer;
   a first passivation layer arranged on a side of the emitter layer away from the silicon wafer;
   a second passivation layer arranged on a side of the silicon wafer away from the emitter layer; and
   an electrode structure arranged on a side of the first passivation layer away from the silicon wafer, and/or arranged on a side of the second passivation layer away from the silicon wafer,
   wherein the electrode structure comprises:
      busbars extending along a first direction and each including two sub-busbars arranged opposite to each other along a second direction intersecting with the first direction, wherein each of the sub-busbars includes first sub-portions and second sub-portions that are spaced at intervals,
      fingers extending along the second direction and arranged at two sides of the busbars, wherein the fingers are connected to the sub-busbars, and
      electrode pads sandwiched between the first sub-portions of the two sub-busbars and connected to the first sub-portions, wherein the first sub-portion of at least one of the sub-busbars protrude towards a side away from the electrode pads,
      wherein connecting end portions are provided at two ends of each of the sub-busbars, the connecting end portions are connected to the first sub-portions, and in the connecting end portions and the first sub-portions that are connected, widths of the connecting end portions in the second direction gradually decrease along a direction from the first sub-portions pointing to the connecting end portions; and/or the connecting end portions are connected to the second sub-portions, and in the connecting end portions and the second sub-portions that are connected, widths of the connecting end portions in the second direction gradually decrease along a direction from the second sub-portions pointing to the connecting end portions.

9. The solar cell according to claim 8, wherein along the second direction, distances between the connecting end portions of the two sub-busbars in one of the busbars are equal.

10. The solar cell according to claim 9, wherein along the second direction, the distances between the connecting end portions of the two sub-busbars in one of the busbars range from 0.5 mm to 3.0 mm.

11. The solar cell according to claim 8, wherein along the second direction, widths of sides of the connecting end portions away from the electrode pads are greater than or equal to 0.1 mm, and widths of sides of the connecting end portions close to the electrode pads are less than or equal to 2 mm.

12. The solar cell according to claim 8, wherein the two sub-busbars of one of the busbars are symmetrically arranged;
along the second direction, a maximum distance between adjacent first sub-portions ranges from 1.2 mm to 1.8 mm, and
along the second direction, a distance between adjacent second sub-portions ranges from 0.9 mm to 1.5 mm.

13. The solar cell according to claim 8, wherein along the first direction, the electrode pads are in contact with the sub-busbars, and a length of a contact region ranges from 0.5 mm to 5.0 mm.

14. The solar cell according to claim 8, wherein along the second direction, widths of the sub-busbars range from 0.2 mm to 0.6 mm.

15. A photovoltaic module, comprising:
a transparent cover plate, an upper packaging layer, a lower packaging layer, and a back plate, and at least one solar cell, wherein the solar cell comprises:
a silicon wafer including an emitter layer on one side of the silicon wafer;
a first passivation layer arranged on a side of the emitter layer away from the silicon wafer;
a second passivation layer arranged on a side of the silicon wafer away from the emitter layer; and
an electrode structure arranged on a side of the first passivation layer away from the silicon wafer, and/or arranged on a side of the second passivation layer away from the silicon wafer,
wherein the electrode structure comprises:
busbars extending along a first direction and each including two sub-busbars arranged opposite to each other along a second direction intersecting with the first direction, wherein each of the sub-busbars includes first sub-portions and second sub-portions that are spaced at intervals,
fingers extending along the second direction and arranged at two sides of the busbars, wherein the fingers are connected to the sub-busbars, and
electrode pads sandwiched between the first sub-portions of the two sub-busbars and connected to the first sub-portions, wherein the first sub-portion of at least one of the sub-busbars protrude towards a side away from the electrode pads,
wherein connecting end portions are provided at two ends of each of the sub-busbars, the connecting end portions are connected to the first sub-portions, and in the connecting end portions and the first sub-portions that are connected, widths of the connecting end portions in the second direction gradually decrease along a direction from the first sub-portions pointing to the connecting end portions; and/or
the connecting end portions are connected to the second sub-portions, and in the connecting end portions and the second sub-portions that are connected, widths of the connecting end portions in the second direction gradually decrease along a direction from the second sub-portions pointing to the connecting end portions.

* * * * *